United States Patent
Tsai

(10) Patent No.: US 6,444,582 B1
(45) Date of Patent: Sep. 3, 2002

(54) METHODS FOR REMOVING SILICON-OXY-NITRIDE LAYER AND WAFER SURFACE CLEANING

(75) Inventor: Ming-Sheng Tsai, Chia-I (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/776,738

(22) Filed: Feb. 5, 2001

(51) Int. Cl.⁷ .................. H01L 21/302; H01L 21/461
(52) U.S. Cl. .................. 438/691; 438/622; 438/625; 438/637; 438/723; 438/740; 438/743; 438/744
(58) Field of Search .................. 483/622, 625, 483/637, 691, 723, 740, 743, 744, 753

(56) References Cited

U.S. PATENT DOCUMENTS 5,939,336 A * 8/1999 Yates .................. 438/753
6,200,891 B1 * 3/2001 Jagannathan et al. ....... 438/622

\* cited by examiner

*Primary Examiner*—David Nelms
*Assistant Examiner*—Reneé R. Berry
(74) *Attorney, Agent, or Firm*—Powell Goldstein Frazer & Murphy LLP

(57) ABSTRACT

Methods for removing a silicon-oxy-nitride layer and wafer surface cleaning are disclosed. The method for removing a silicon-oxy-nitride layer utilizes a solution of ethylene glycol and hydrogen fluoride to completely remove the silicon-oxy-nitride layer from a substrate. Moreover, the method for wafer surface cleaning also uses a solution of ethylene glycol and hydrogen fluoride to remove chemical oxide or native oxide from wafer surfaces and an ethylene glycol solvent to rinse the wafer surfaces.

14 Claims, 3 Drawing Sheets

METHODS FOR REMOVING SILICON-OXY-NITRIDE LAYER AND WAFER SURFACE CLEANING

BACKGROUND OF THE INVENTION

1. Field of the Invention

The present invention relates to methods for removing a silicon-oxy-nitride layer from a semiconductor substrate and wafer surface cleaning, and more particularly to methods for removing a silicon-oxy-nitride layer without residual oxide and wafer surface cleaning.

2. Description of the Related Art

Silicon oxy-nitride ($SiO_xN_y$) layers formed over polysilicon layers used as gate electrodes in semiconductor devices are commonly used as bottom anti-reflective coating (BARC) layers. The BARC layers are formed over the polysilicon layers before forming photoresist layers used to define the gate electrodes, and they prevent reflection of actinic light used to expose the photoresist layers from their surfaces. The processing set forth is extremely crucial for the manufacturing techniques of very large scale integrated circuit (VLSI) and ultra large scale integrated circuit (ULSI). After the lithography process defines the gate electrodes, the silicon-oxy-nitride layer is removed using a dry etching process or a wet etching process using a heated phosphorus acid ($H_3PO_4$) solution. In addition, when the quality of the deposited silicon-oxy-nitride layer is unqualified, the silicon-oxy-nitride layer must be removed completely using the heated $H_3PO_4$ solution. However, the silicon-oxy-nitride layer is usually difficult to remove completely as it contains oxide composition. Furthermore, plasma of the dry etching process may cause undesired damage that may induce device failure. Therefore, it is very necessary to provide a new option to remove the silicon-oxy-nitride layers without the problems mentioned above.

Standard clean 1 (SC1) or RCA1 and standard clean 2 (SC2) or RCA2 are almost the standard cleaning techniques and recipes throughout integrated circuit processing. The SC1 solution comprises a hot aqueous mixture of ammonium hydroxide, hydrogen peroxide, and water (1:1:5 of 30%. $H_2O_2$, 28% $NH_4OH$ and $H_2O$) and the SC2 solution comprises a hot acid mixture of hydrogen peroxide, hydrochloric acid and water (1:1:5 of 30% $H_2O_2$, 37% HCl and $H_2O$). Both the SC1 and SC2 solutions contain hydrogen peroxide, which easily reacts with silicon atoms of the wafer surface to form chemical oxide layers. Usually, these chemical oxide layers are removed using dilute hydrofluoric (DHF) acid, but the DHF acid causes the formation of a hydrogen-terminated or hydrogen-passivated layer. The undesired hydrogen-terminated layer is hydrophobic and susceptible to particle contamination which will result in defects in the following formed films.

The hydrogen-passivated layer easily causes the formation of a native oxide layer when a wafer is exposed to the atmosphere. Especially during wafer transport in the clean room or reactor pump down, silicon atoms of the wafer surface having dangling bonds will adsorb hydrogen atoms to form a hydrophobic hydrogen-terminated surface. In this manner, oxygen will bond with silicon atoms to form an undesired native oxide layer. FIG. 1A shows the growth of the native oxide layer on a hydrogen-terminated surface of a silicon wafer exposed in the atmosphere. Besides, as a wafer is immersed in water or rinsed by deionized (DI) water, hydroxyl or oxygen atom will bond with silicon atoms of the wafer surface to form an oxygen-terminated or hydroxyl-terminated layer as shown in FIG. 1B. Silicon-hydroxyl groups formed by physically adsorbed water molecules undergoing dissociative chemisorption on silicon atoms act as adsorption sites for additional water molecules and result in further oxidation.

After performing wafer surface cleaning procedures by using the SC1 and SC2 solutions to clean wafers or the DHF acid to remove the native oxide and the chemical oxide, DI water is often used sequentially by the semiconductor industry to rinse the wafers. According to the phenomenon mentioned above, a native oxide layer is very likely formed again after performing the standard or conventional wafer surface cleaning procedures. Moreover, in the following dry procedure, however, undesired contaminations, such as water marks, particles and even silicon powders may be induced. Therefore, it is necessary to provide a new wafer surface cleaning method to replace the conventional one without the problems set forth.

SUMMARY OF THE INVENTION

It is therefore an object of the invention to provide a mixture solution of ethylene glycol (EG) and hydrogen fluoride (HF) to replace the conventional wet etching solution to completely remove a silicon-oxy-nitride layer containing oxide.

It is another object of this invention to provide a wet etching process used a mixture solution of ethylene glycol and hydrogen fluoride to replace the conventional dry etching process to remove silicon-oxy-nitride layer without plasma damages.

It is a further object of this invention to provide a method for wafer surface cleaning used a mixture solution of ethylene glycol and hydrogen fluoride to replace the conventional one used a solution of HF and $H_2O$ (Dilute HF Solution) to effectively reduce the formation of undesired hydrophobic hydrogen-terminated layers on the wafer surface, therefore avoid particle contaminations and water absorption.

It is another object of this invention to provide a method for wafer surface cleaning used a mixture solution of ethylene glycol and hydrogen fluoride to replace the conventional one used a solution of HF and $H_2O$ to reduce wafer surface roughness and prevent water marks.

To achieve these objects, and in accordance with the purpose of the invention the invention utilizes a solution of ethylene glycol and hydrogen fluoride to completely remove the silicon-oxy-nitride layer from a substrate without residual oxide. Moreover, the method for wafer surface cleaning also uses a solution of ethylene glycol and hydrogen fluoride to remove chemical oxide or native oxide from wafer surfaces and an ethylene glycol solvent to rinse the wafer surfaces.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
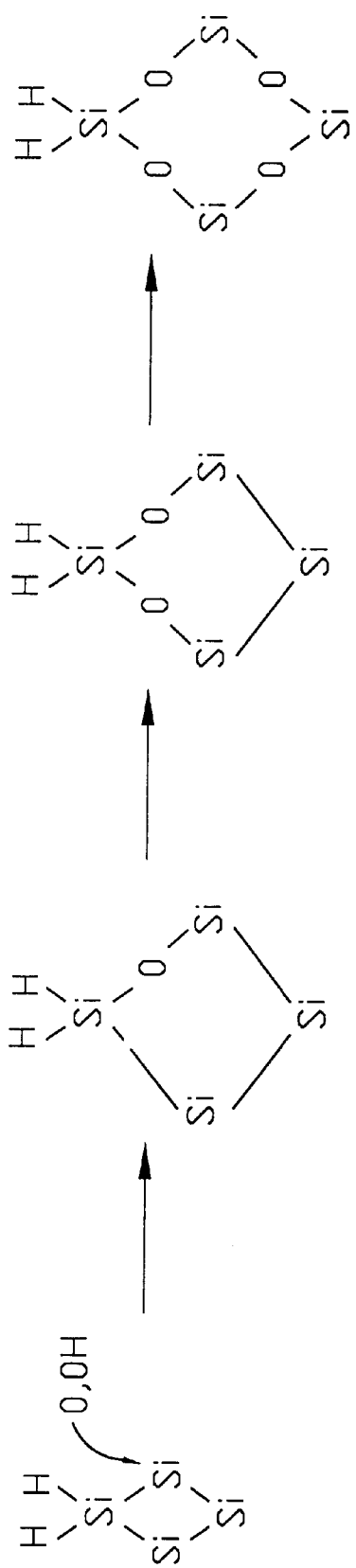
FIG. 1A shows the growth of a native oxide layer on a hydrogen-terminated surface of a silicon wafer exposed in the atmosphere.
Figure 1B:
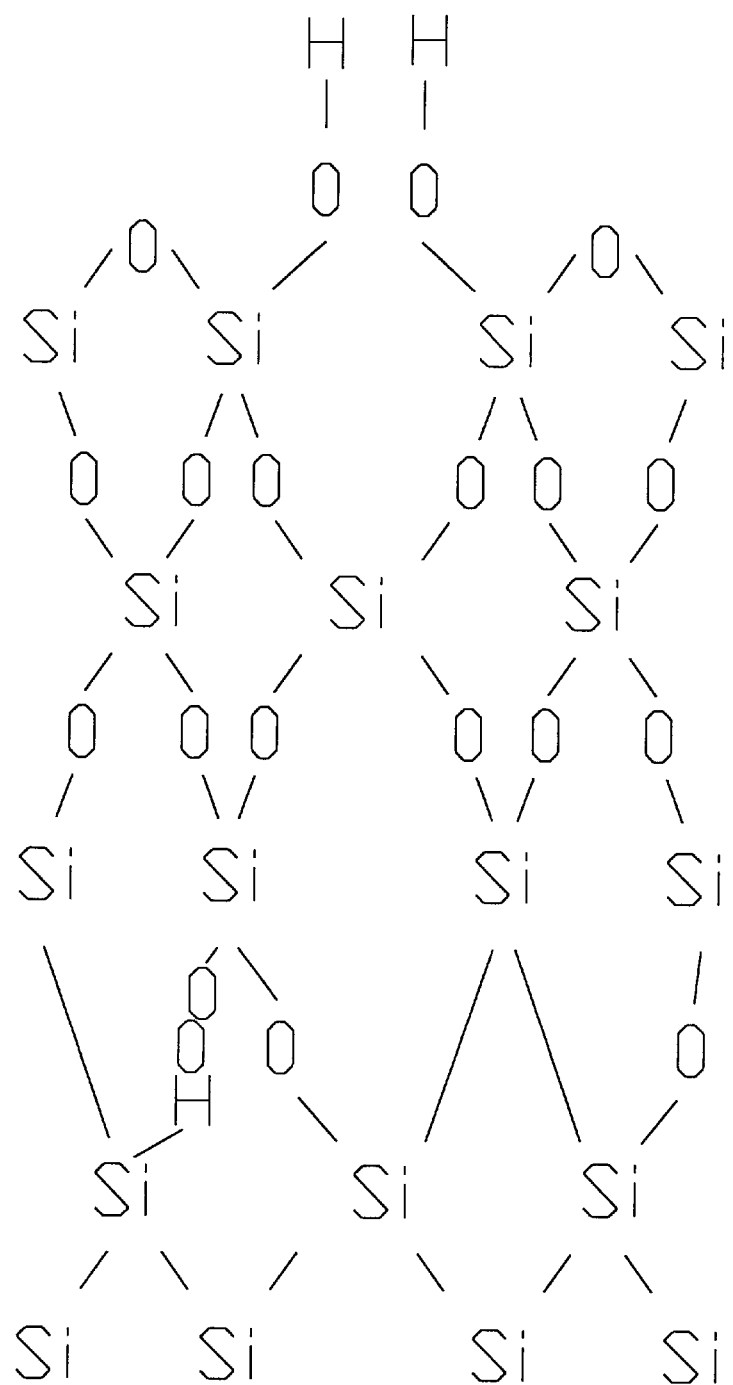
FIG. 1B shows a native oxide layer on an oxygen-terminated and hydroxyl-terminated surface of a silicon wafer.

The invention uses a mixture solution of ethylene glycol and hydrogen fluoride as a new etching solution of a silicon-oxy-nitride layer and a new wafer surface cleaning solution in modern semiconductor process. As an etching solution of a silicon-oxy-nitride layer, the mixture solution of ethylene glycol and hydrogen fluoride can completely remove a deposited silicon-oxy-nitride layer from a semiconductor substrate whereas the conventional heated phosphorus acid solution can not. This is so because the silicon-oxy-nitride layer always contains oxide which cannot be effectively removed by the heated phosphorous acid solution.

As a wafer surface cleaning solution, the mixture solution of ethylene glycol and hydrogen fluoride of the invention is used to replace the dilute hydrofluoric acid solution used to remove a native oxide layer and a chemical oxide layer. It is found that ethylene glycol can vary the hydroxyl radical and dissolved oxygen concentrations, which are known to affect the oxidation kinetics of hydrophobic hydrogen-terminated layers, and is expected to aid the creation of a uniform, oxide-free surface since ethylene glycol is an effective wetting agent.

In modern deep-submicron integrated circuit process, the application of the solution of ethylene glycol and hydrogen fluoride as a new etching solution of a silicon-oxy-nitride layer will be described hereinafter. In this embodiment, the silicon-oxy-nitride layer is used as a bottom anti-reflective coating layer also known as a BARC layer. The BARC layer is deposited on a semiconductor substrate having a conductive layer thereon used as a gate electrode to improve the critical dimension control of the gate electrode in a photolithography process. The semiconductor substrate is preferably a silicon substrate with a <100> crystal orientation. The conductive layer is preferably a polysilicon layer. The silicon-oxy-nitride layer can be formed by using a conventional chemical vapor deposition (CVD) process, and is preferably a plasma enhanced chemical vapor deposition (PECVD) process. To define the gate electrode, a photoresist layer is formed on the silicon-oxy-nitride layer. The gate electrode can be defined by using a conventional photolithography process. After defining the gate electrode, the photoresist layer is firstly stripped. Then the BARC layer must be removed completely for further processing. The BARC layer is removed by immersing the semiconductor substrate in a mixture solution of ethylene glycol and hydrogen fluoride. Ethylene glycol is used as a solvent and hydrogen fluoride is a solute. The concentration of hydrogen fluoride is about 2 to about 6 percent by volume, and is preferably about 4 percent. The etching temperature is in the range of about 30° C. to about 90° C. It is found that as the concentration of hydrogen fluoride increases, the etching rate of oxide in the silicon-oxy-nitride layer also raises.

The embodiment set forth is an example only, and it should not be treated as confinements of the scope and spirit of the invention. In stead, the solution of ethylene glycol and hydrogen fluoride of the invention can be used to etch or completely remove any silicon-oxy-nitride layer in semiconductor processes.

In another embodiment, the solution of ethylene glycol and hydrogen fluoride of the invention is used to clean wafers. According to the description of the related art, the wafer surface cleaning procedures by using the standard cleaning recipes SC1 and SC2 leave the cleaned wafer surface with an undesired chemical oxide layer of about 15 angstroms, which is harmful to the sequential growth of an epitaxial silicon layer or a silicon dioxide layer and usually lead to a high contact resistance and device failures. Conventionally, a dilute hydrofluoric acid (DHF) aqueous solution with a mixing ratio of 1:100 is utilized to remove the chemical oxide layer before performing a further process. The DHF solution treatment always leaves the treated wafer with a hydrogen-terminated surface, which is hydrophobic and susceptible to adsorb contaminant particles. It is found that the growth of the hydrogen-terminated surface strongly depends on the concentrations of hydroxyl and dissolved oxygen and ethylene glycol can effectively vary the hydroxyl and dissolved oxygen concentrations and hence affect the oxidation kinetics of a hydrogen-terminated surface. Also, the solution of ethylene glycol and hydrogen fluoride provides less hydrogen-termination than the aqueous DHF solution. In addition, fluoric ions in the solution of ethylene glycol and hydrogen fluoride can react with hydrogen fluoride to form $HF_2^-$ which is thought to play a role in the uniformity of silicon dioxide etching. Thus the treatment of wafer surfaces by using the solution of ethylene glycol and hydrogen fluoride produces silicon surfaces that are smoother and less prone to particulate contamination.

Figure 2:
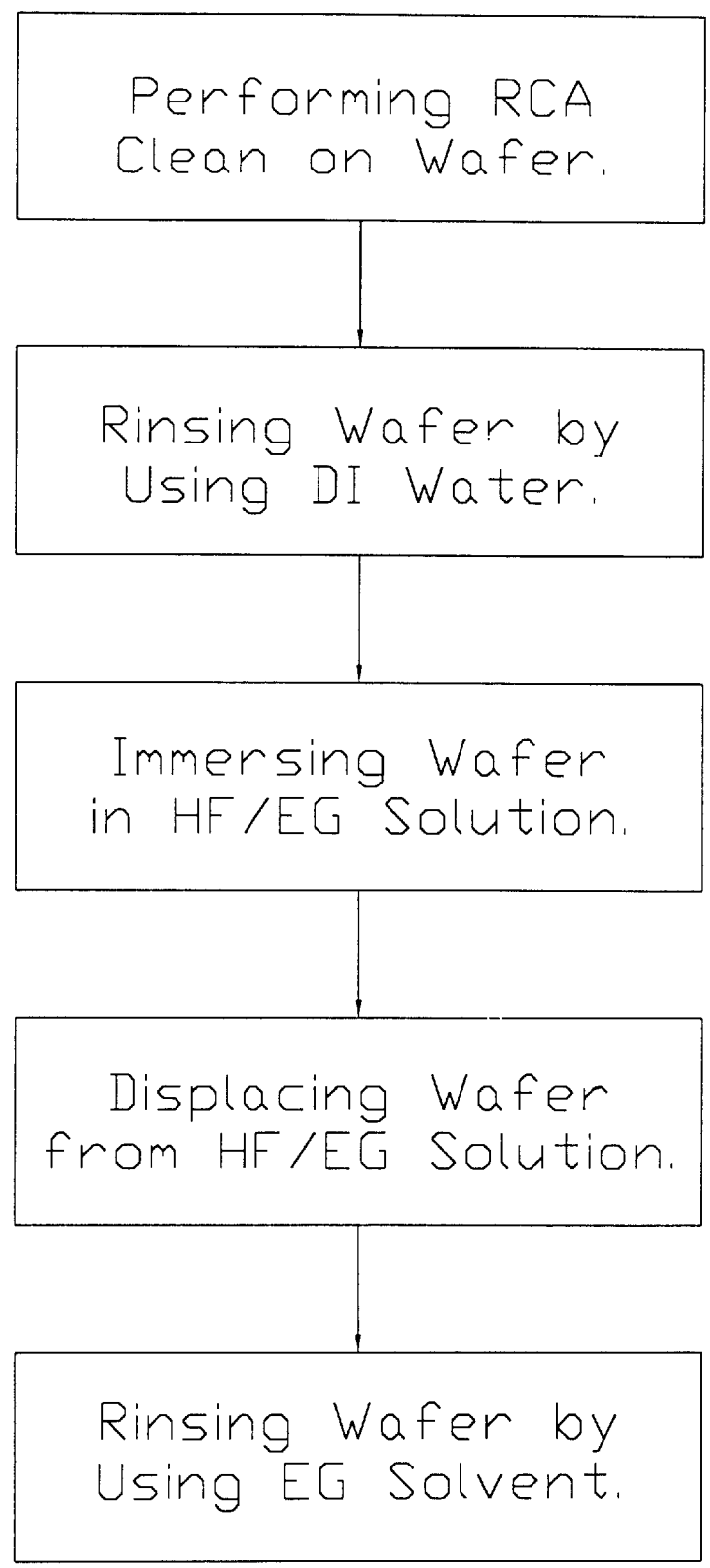
FIG. 2 shows the process flow diagram of the wafer surface cleaning of this invention.

The application of the wafer surface cleaning procedure of the invention will be described hereinafter. In a common wafer-cleaning recipe, after performing the RCA clean process on a silicon wafer by using the SC1 and SC2 solutions, the silicon wafer is rinsed by using DI water. Then the wafer is immersed in the solution of ethylene glycol and hydrogen fluoride to remove the oxide layer. The concentration of hydrogen fluoride is about 2 to about 6 percent by volume, and is preferably about 4 percent. The clean temperature is about 20° C. to 30° C. Next an ethylene glycol solvent is used to rinse the wafer. In this manner, the invention provides the cleaned wafer with a smooth surface, meanwhile, less particles and no water mark appear. The process flow is shown in FIG. 2.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for removing a silicon-oxy-nitride layer, said method comprising:

providing a substrate having a silicon-oxy-nitride layer thereon;

and immersing said substrate in a solution of ethylene glycol and hydrogen fluoride at a temperature.

2. The method according to claim 1, wherein said solution comprises about 2 percent to about 6 percent hydrogen fluoride by volume.

3. The method according to claim 1, wherein said solution comprises about 94 percent to about 98 percent ethylene glycol by volume.

4. The method according to claim 1, wherein said temperature is in a range of about 30° C. to about 90° C.

5. A method for wafer surface cleaning, said method comprising:

providing a wafer surface;

rinsing said wafer surface by using deionized water;

immersing said wafer surface in a solution of ethylene glycol and hydrogen fluoride;

displacing said wafer surface from said solution; and rinsing said wafer surface by using a ethylene glycol solvent.

6. The method according to claim 5, wherein said wafer surface is a silicon wafer surface.

7. The method according to claim 5, wherein said solution comprises about 2 percent to about 6 percent hydrogen fluoride by volume.

8. The method according to claim 5, wherein said solution comprises about 94 percent to about 98 percent ethylene glycol by volume.

9. A method for wafer surface cleaning, said method comprising:

providing a wafer surface;

cleaning said wafer surface by using a first solution;

rinsing said wafer surface by using deionized water;

cleaning said wafer surface by using a second solution;

rinsing said wafer surface by using deionized water;

immersing said wafer surface in a solution of ethylene glycol and hydrogen fluoride;

displacing said wafer surface from said solution; and rinsing said wafer surface by using a ethylene glycol solvent.

10. The method according to claim 9, wherein said wafer surface is a silicon wafer surface.

11. The method according to claim 9, wherein said first solution is a standard clean 1 solution.

12. The method according to claim 9, wherein said second solution is a standard clean 2 solution.

13. The method according to claim 9, wherein said solution comprises about 2 percent to about 6 percent hydrogen fluoride by volume.

14. The method according to claim 9, wherein said solution comprises about 94 percent to about 98 percent ethylene glycol by volume.

* * * * *